United States Patent [19]

Inoue et al.

[11] Patent Number: 5,084,647
[45] Date of Patent: Jan. 28, 1992

[54] PIEZOELECTRIC FILTER

[75] Inventors: Jiro Inoue; Masao Gamo; Hiroshi Nakatani, all of Nagaokakyo, Japan

[73] Assignee: Murata Manufacturing Co., Ltd., Japan

[21] Appl. No.: 555,566

[22] Filed: Jul. 19, 1990

[30] Foreign Application Priority Data

Jul. 19, 1989 [JP] Japan .................. 1-186775
Jul. 19, 1989 [JP] Japan .................. 1-186776

[51] Int. Cl.5 ............................. H01L 41/08
[52] U.S. Cl. ........................ 310/320; 310/358; 310/359; 310/366
[58] Field of Search ........... 310/320, 358, 357, 366

[56] References Cited

U.S. PATENT DOCUMENTS

| | | | |
|---|---|---|---|
| 3,582,839 | 6/1971 | Pim et al. | 310/320 |
| 4,605,876 | 8/1986 | Ogawa et al. | 310/358 |
| 4,652,784 | 3/1987 | Inoue et al. | 310/320 |
| 4,894,577 | 1/1990 | Okamoto et al. | 310/366 |
| 4,894,580 | 1/1990 | Ogawa | 310/358 |
| 4,918,350 | 4/1990 | Ando et al. | 310/358 |
| 4,939,403 | 7/1990 | Kittaka et al. | 310/358 |
| 4,950,970 | 2/1990 | Ando et al. | 310/358 |

FOREIGN PATENT DOCUMENTS 6915115  4/1971  Netherlands .......... 310/358

Primary Examiner—Mark O. Budd
Assistant Examiner—Thomas M. Dougherty
Attorney, Agent, or Firm—Ostrolenk, Faber, Gerb & Soffen

[57] ABSTRACT

A piezoelectric filter of an energy-trapped type utilizing a second harmonic wave of the thickness-extensional vibration mode, characterized in that an earth electrode is formed around the center of a piezoelectric substrate in the direction of thickness, and an input electrode and an output electrode are formed on one or both major surfaces of the piezoelectric substrate so as to be opposed to the earth electrode.

25 Claims, 5 Drawing Sheets

PIEZOELECTRIC FILTER

BACKGROUND OF THE INVENTION

1. Field of the Invention

The present invention relates generally to a piezoelectric filter of an energy-trapped type, and more particularly, to a three-terminal piezoelectric filter of an energy-trapped type using a second harmonic wave of the thickness-extensional vibration mode.

2 Description of the Prior Art

FIG. 7 illustrates conventional double-mode piezoelectric filter of an energy-trapped type using the thickness-extensional vibration mode (referred to as TE mode hereinafter). In this piezoelectric filter, an input electrode 53 and an output electrode 54 are arranged in close proximity on one major surface of a piezoelectric substrate 51 polarized in the direction of thickness. An earth electrode 52 is formed on the other major surface of the piezoelectric substrate 51 so as to be opposed to the input electrode 53 and the output electrode 54. This piezoelectric filter has a structure using a fundamental wave of the TE mode. Arrows in FIG. 7 indicate the direction of polarization.

In the above described conventional piezoelectric filter using the fundamental wave of the TE mode, materials having a Poisson's ratio of $\frac{1}{3}$ or more must be used as materials for the piezoelectric substrate so as to achieve energy trapping. More specifically, when the fundamental wave of the TE mode is utilized, dispersion curves vary with the Poisson's ratio of the materials for the piezoelectric substrate, as shown in FIGS. 8A and 8B.

FIG. 8A shows a dispersion curve of the fundamental wave of the TE mode in a case where the materials for the piezoelectric substrate has an (effective) Poisson's ratio of $\frac{1}{3}$ or more, and FIG. 8B shows a dispersion curve of the fundamental wave of the TE mode in a case where it has an (effective) Poisson's ratio of less than $\frac{1}{3}$. In each of FIGS. 8A and 8B, the axis of ordinate represents a frequency f and the axis of abscissa is a wave number k. The right half of the axis of abscissa indicates a real region of k, and the left half thereof indicates an imaginary region of k. In addition, a solid line Q is a dispersion curve in a no-electrode portion provided with no input and output electrodes and no earth electrode, and a broken line R is a dispersion curve in an electrode portion having electrodes formed on its surface. In the electrode portion, the dispersion curve is shifted to a lower frequency side due to the piezoelectric reaction and the mass load effect of the electrodes. Accordingly, a cut-off frequency $f_{11}$ of the fundamental wave in the electrode portion is lower than a cut-off frequency $f_{10}$ of the fundamental wave in the no-electrode portion ($f_{11} < f_{10}$).

As shown in FIG. 8A, in a case where the Poisson's ratio is $\frac{1}{3}$ or more, the wave number k in the electrode portion becomes a real number at frequencies higher than the cut-off frequency $f_{11}$, while the wave number k in the no-electrode portion becomes an imaginary number at frequencies lower than the cut-off frequency $f_{10}$. Accordingly, at the frequency f in the range of $f_{11}$ to $f_{10}$, a propagation mode of vibration exists in the electrode portion, while vibration is not propagated in the no-electrode portion, to be damped, thereby to achieve trapping of vibratory energy in the vicinity of the electrode portion.

On the other hand, as shown in FIG. 8B, in a case where the Poisson's ratio is less than $\frac{1}{3}$, the wave number k in the electrode portion becomes a real number at frequencies lower than the cut-off frequency $f_{11}$, while the wave number k in the no-electrode portion becomes an imaginary number at frequencies higher than the cut-off frequency $f_{10}$. Moreover, $f_{11} < f_{10}$. Accordingly, in this case, there exists no frequency region where the wave number is a real number in the electrode portion and the wave number is an imaginary number in the no-electrode portion, thereby to make it impossible to trap vibratory energy.

Therefore, in the piezoelectric filter using the fundamental wave of the TE mode, piezoelectric materials having an (effective) Poisson's ratio of $\frac{1}{3}$ or more such as piezoelectric ceramics of the titanate zirconate (PZT) system must be used so as to achieve energy trapping. More specifically, materials usable for the piezoelectric substrate are limited. Consequently, even if there exist materials favorable as the materials for the piezoelectric substrate such as piezoelectric materials superior in temperature characteristics, materials high in Q, materials low in loss or materials large in attenuation amount, the materials cannot be employed if the Poisson's ratio thereof is less than $\frac{1}{3}$. Accordingly, it is difficult to construct a filter or the like having substantially superior characteristics.

Furthermore, the thickness of a device of the piezoelectric filter having a structure shown in FIG. 7 may be reduced so as to heighten the frequency at which the piezoelectric filter is used. If the device is caused to be usable in a high frequency region, however, the thickness of the device becomes too small, thereby to make it difficult to process and handle the device in the manufacturing processes. Consequently, the conventional piezoelectric filter has a limit in heightening the frequency at which the piezoelectric filter is used.

SUMMARY OF THE INVENTION

The present invention has been made to overcome the disadvantages of the above described conventional piezoelectric filter and has for its object to provide a piezoelectric filter of an energy-trapped type for which piezoelectric materials suitable for applications can be selected from among more materials and can be used in a higher frequency region.

The piezoelectric filter according to the present invention is a piezoelectric filter of an energy-trapped type utilizing the thickness-extensional vibration mode and has a structure in which an earth electrode is formed around the center of a piezoelectric substrate in the direction of thickness and an input electrode and an output electrode are formed on one or more major surfaces of the piezoelectric substrate so as to be opposed to the earth electrode.

In the piezoelectric filter according to the present invention, the earth electrode is formed around the center of the piezoelectric substrate, and the input electrode and the output electrode are formed on a major surface or surfaces thereof. Accordingly, the distance between the input and output electrodes and the earth electrode becomes one-half the thickness of the piezoelectric substrate. In a three-terminal type piezoelectric filter, therefore, it is possible to excite the vibration of a second harmonic wave of the TE mode.

In the case of using the fundamental wave of the TE mode, as discussed above, piezoelectric materials having a Poisson's ratio of $\frac{1}{3}$ more must be used as a required condition under which energy trapping is achieved. However, the piezoelectric filter according to the present invention is not subjected to such a restriction because it utilizes the vibration of the second harmonic wave of the TE mode. Consequently, it is possible to use materials for a piezoelectric substrate which have not been conventionally usable because the Poisson's ratio thereof is less than ⅓. More specifically, materials for a piezoelectric substrate can be selected from a wider range of piezoelectric materials than conventional ones. Consequently, it is possible to use materials for a piezoelectric substrate, for example, higher in Q and superior in temperature characteristics, as compared with the piezoelectric materials so far used, thereby to make it possible to fabricate a three-terminal type piezoelectric filter superior in temperature characteristics and low in loss and large in attenuation amount.

It is disclosed in the U.S. Pat. No. 4,918,350 that a piezoelectric-resonance device of an energy-trapped type can be constructed using piezoelectric materials having a Poisson's ratio of less than ⅓ by utilizing a higher harmonic of the thickness-extensional vibration mode. In this specification, therefore, the description of, for example, the type of materials having a Poisson's ratio of less than ⅓ will not be repeated, and instead, the contents disclosed in this U.S. Pat. No. 5,918,350 will be incorporated by reference.

Furthermore, according to the present invention, the second harmonic wave of the TE mode is used. Accordingly, the frequency at which the piezoelectric filter is used can be doubled without reducing the thickness of a device of the piezoelectric filter. Consequently, it becomes possible to simply fabricate a three-terminal type piezoelectric filter which is superior in substrate strength and is usable for high frequency applications.

Additionally, according to a particular aspect of the present invention, the earth electrode is provided inside of the piezoelectric substrate and the input and output electrodes are provided on one major surface thereof. Accordingly, a conductive film for frequency adjustment, for example, a film formed by evaporation, can be provided on the other major surface, provided with no input and output electrodes or the like, of the piezoelectric substrate. Consequently, the central frequency of the piezoelectric filter can be easily adjusted by, for example, applying or eliminating the conductive film. In addition, a piezoelectric substrate portion between the earth electrode and the major surface provided with no input and output electrodes, of the piezoelectric substrates has the mass load effect. Consequently, energy trapping is effectively achieved by the mass load effect.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
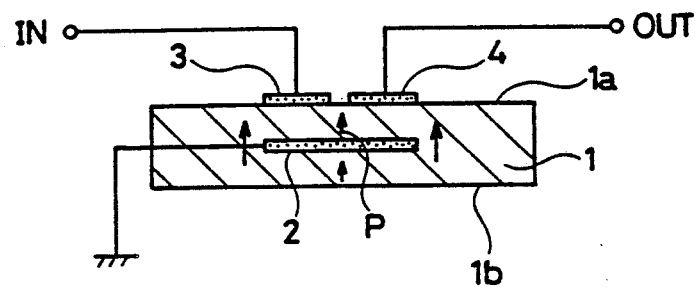
FIG. 1 is a cross-sectional view showing a piezoelectric filter according to one embodiment of the present invention.

FIG. 1 illustrates a piezoelectric filter according to one embodiment of the present invention. A piezoelectric substrate 1 obtained by sintering a piezoelectric ceramic material is subjected to polarization processing throughout the direction of thickness (the direction of polarization is indicated by arrows P). This piezoelectric substrate 1 is so constructed that the thickness-extensional vibration is excited by applying a signal to electrodes as described below.

An earth electrode 2 is formed in a central layer in the direction of thickness inside of the piezoelectric substrate 1. An input electrode 3 and an output electrode 4 are provided separated from each other on a major surface 1a of the piezoelectric substrate 1 so as to be opposed to the earth electrode 2.

Figure 2:
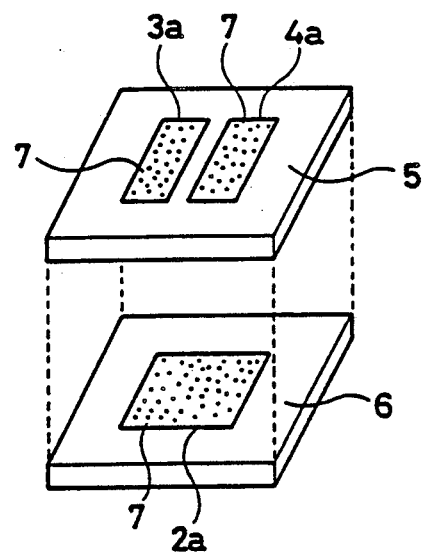
FIG. 2 is a perspective view for explaining the manufacturing processes of the piezoelectric filter according to the embodiment shown in FIG. 1.

This piezoelectric filter is a piezoelectric filter of an energy-trapped type and thus, is so constructed that the earth electrode 2 and the input and output electrodes 3 and 4 have areas smaller than the major surface of the piezoelectric substrate 1 and do not lead to outer peripheral edges of the piezoelectric substrate 1 (see FIG. 2).

Furthermore, the input and output electrodes 3 and 4 opposed to the earth electrode 2 have the same area and are symmetrically arranged. Consequently, this piezoelectric filter is a double-mode filter in which the vibrations in a symmetrical mode and an asymmetrical mode are excited. In addition, the earth electrode 2 is formed in the central layer in the direction of thickness of the device in the piezoelectric substrate 1. In this piezoelectric filter, therefore, the vibration of a second harmonic wave having a wavelength which is one-half that of the fundamental wave is excited.

Figure 3:
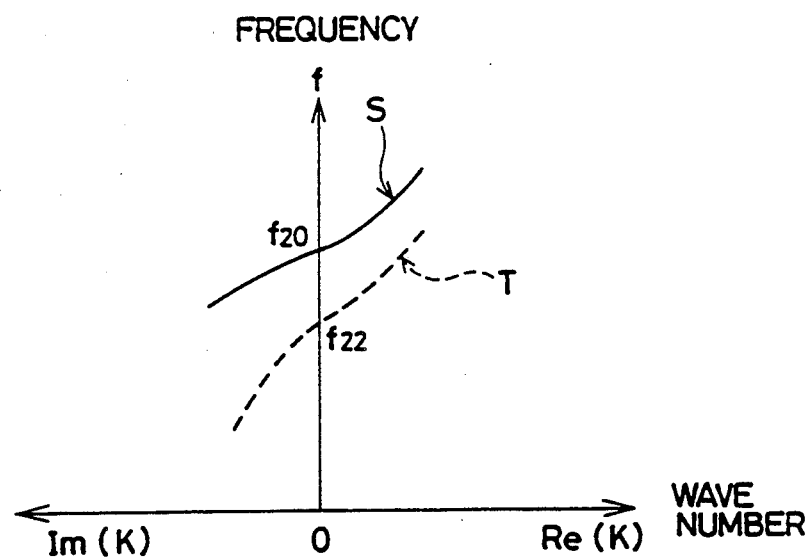
FIG. 3 is a diagram showing dispersion curves in an electrode portion and a no-electrode portion of the piezoelectric filter according to the embodiment shown in FIG. 1.
Figure 8A:
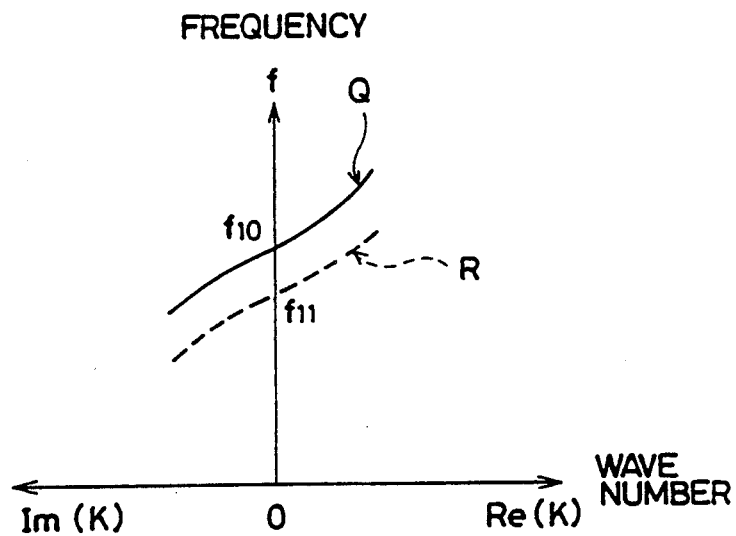
FIG. 8A and 8B are diagrams respectively showing dispersion curves in using materials having a Poisson's ratio of ⅓ or more and in using materials having a Poisson's ratio of less than ⅓ in the conventional piezoelectric filter.
Figure 8B:
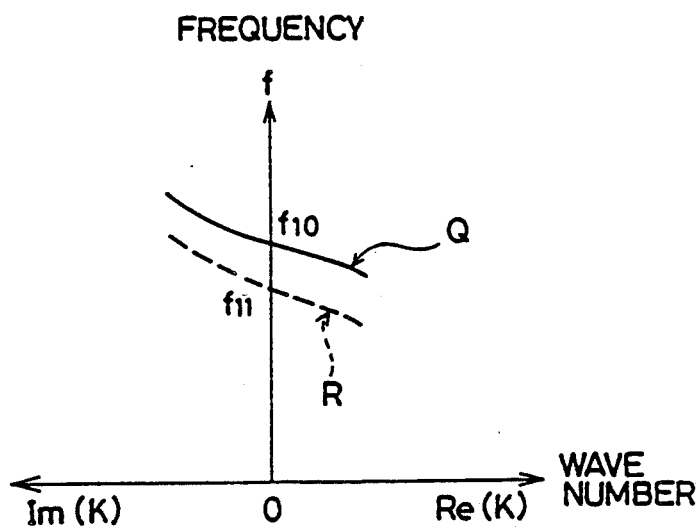

FIG. 3 schematically shows dispersion curves with respect to the above described second harmonic wave of the TE mode. The ordinate indicates a frequency f and the abscissa indicates a wave number k (the right half of the axis of abscissa indicates a real region and the left half thereof indicates an imaginary region). A solid line S represents a dispersion curve in a region, provided with no electrodes, of a piezoelectric resonator, and a broken line T represents a dispersion curve in a region provided with electrodes. The second harmonic wave of the TE mode is represented by the dispersion curves as shown in FIG. 8 in cases where the Poisson's ratio is both less than ⅓ and ⅓ or more, unlike the fundamental wave of the TE mode. In the case of the second harmonic wave of the TE mode, therefore, at a frequency f between a cut-off frequency $f_{22}$ of the second harmonic wave in the electrode portion and a cut-off frequency $f_{20}$ of the second harmonic wave in the no-electrode portion ($f_{22} < f < f_{20}$), the wave number k becomes a real number in the electrode portion, while the wave number k becomes an imaginary number in the no-electrode portion, to achieve trapping of vibratory energy irrespective of the value of the Poisson's ratio.

Therefore, it becomes possible to use piezoelectric materials having a Poisson's ratio of less than $\frac{1}{3}$ which have not been conventionally usable, for example, $PbTiO_3$, $LiTaO_3$, $LiNbO_3$ and $Li_2B_4O_7$. More specifically, materials suitable for applications can be selected from a wide range of piezoelectric materials. For example, piezoelectric materials high in Q and superior in temperature characteristics can be selected from a wide range of materials and used, thereby to make it possible to improve the temperature characteristics of the piezoelectric filter. In addition, it is also possible to select piezoelectric materials lower in loss and such piezoelectric materials allow the attenuation amount in a rejection band to be increased.

Furthermore, the use of the second harmonic wave makes it possible to fabricate a piezoelectric filter having a central frequency which is twice that of the piezoelectric filter using the fundamental wave if the devices of the piezoelectric filters have the same thickness. In addition, the thickness of the device of the piezoelectric filter using the second harmonic wave can be made twice that of the device of the piezoelectric filter using the fundamental wave if the piezoelectric filters have the same central frequency. Accordingly, a piezoelectric filter suitable for high frequency applications can be easily achieved and at the same time, the piezoelectric filter can be fabricated by a simple processes. For example, the piezoelectric filter is not easily cracked and chipped during processing in the manufacturing processes, and the green sheets are easily handled.

Moreover, no input and output electrodes are provided on a lower major surface 1b of the piezoelectric substrate 1. Accordingly, films such as an evaporation film for frequency adjustment or a conductive film formed by printing and sintering a conductive paste can be provided on the lower major surface 1b. The frequency adjustment can be easily made by applying such an evaporation film or the like to the lower major surface 1b or subsequently eliminating the same.

Additionally, a piezoelectric substrate portion between the earth electrode and the lower major surface 1b has the mass load effect. Accordingly, the cut-off frequency $f_{22}$ becomes lower, thereby to make it possible to effectively achieve energy trapping in the electrode portion.

FIG. 2 shows one example of a method of fabricating the above described piezoelectric filter. Electrode pastes 7 are printed on the upper surface of one green sheet 5 out of two green sheets 5 and 6 of piezoelectric ceramics formed in accordance with the usual doctor blade process or the like, to form electrode patterns 3a and 4a to be an input electrode 3 and an output electrode 4. An electrode pattern 2a to be an earth electrode 2 is formed on the upper surface of the other green sheet 6. Thereafter, the green sheets 5 and 6 are laminated in the state shown in FIG. 2 with the electrode patterns 2a to 4a being positioned, pressed, sintered, and subjected to polarization processing to be polarized throughout the direction of thickness of the device, thereby to fabricate a piezoelectric filter.

Although in FIG. 1, a piezoelectric substrate portion between the major surface 1b and the earth electrode 2 is subjected to polarization processing in the same direction as that in a piezoelectric substrate portion between the input and output electrodes 3 and 4 and the earth electrode 2, the piezoelectric substrate portion between the major surface 1b and the earth electrode 2 may alternatively be subjected to polarization processing in the direction opposite to that in the piezoelectric substrate portion between the input and output electrodes 3 and 4 and the earth electrode 2. In addition, the piezoelectric substrate portion between the major surface 1b and the earth electrode 2 may not be polarized.

Figure 4:
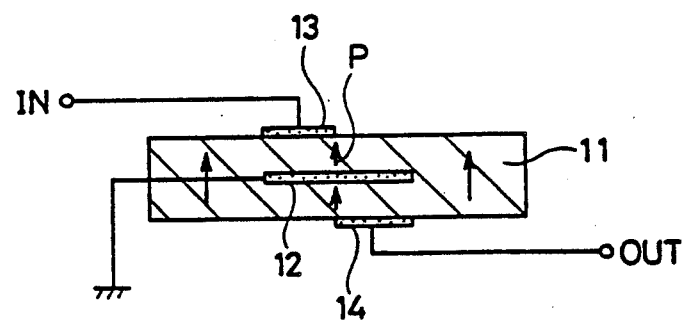
FIG. 4 is a cross-sectional view showing a piezoelectric filter according to another embodiment of the present invention.
Figure 5:
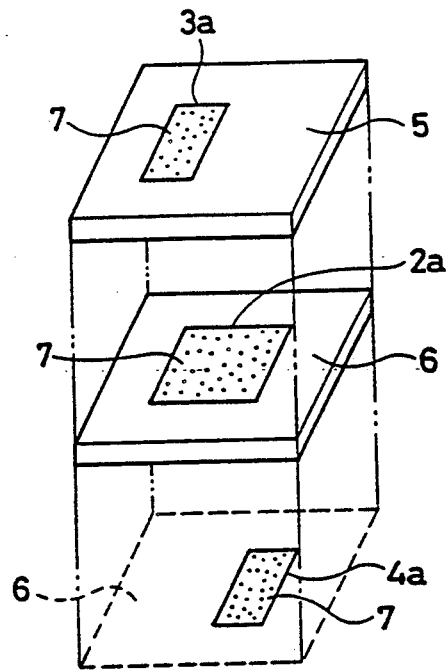
FIG. 5 is a perspective view for explaining the manufacturing processes of the piezoelectric filter according to the embodiment shown in FIG. 4.

FIG. 4 is a cross-sectional view illustrating a piezoelectric filter according to another embodiment of the present invention, and FIG. 5 is an exploded perspective view for explaining the processes of manufacturing this piezoelectric filter.

The piezoelectric filter according to the present embodiment is the same as the piezoelectric filter according to the embodiment shown in FIG. 1 except that an input electrode 13 and an output electrode 14 are respectively formed on one major surface and the other major surface of a piezoelectric substrate 11. Therefore, the description of the embodiment shown in FIG. 1 is incorporated by assigning corresponding reference numerals to portions identical or corresponding to those of the piezoelectric filter according to the embodiment shown in FIG. 1.

Also in the present embodiment, an earth electrode 12 is formed at the center of the piezoelectric substrate 11 in the direction of thickness, and the input electrode 13 and the output electrode 14 are formed on the major surfaces of the piezoelectric substrate 11. Accordingly, the vibration of a second harmonic wave having a wavelength which is one-half that of a fundamental wave is excited.

Figure 6:
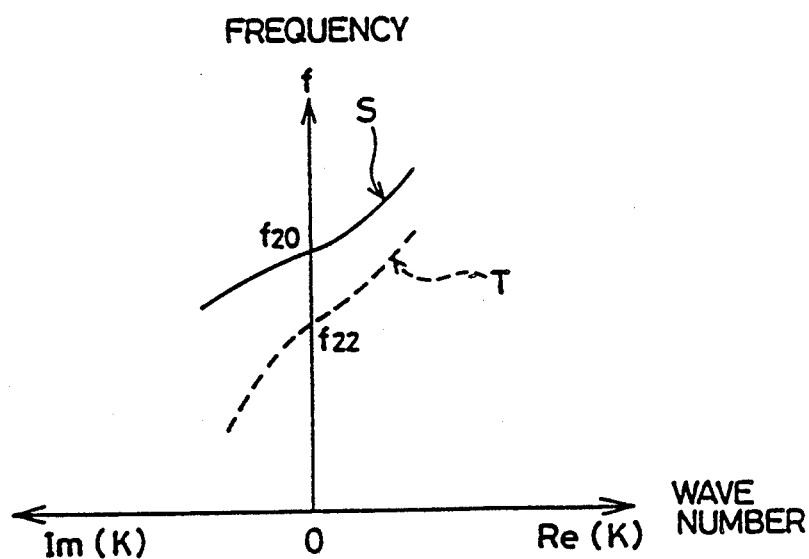
FIG. 6 is a diagram showing dispersion curves in an electrode portion and a no-electrode portion of the piezoelectric filter according to the embodiment shown in FIG. 4.
Figure 7:
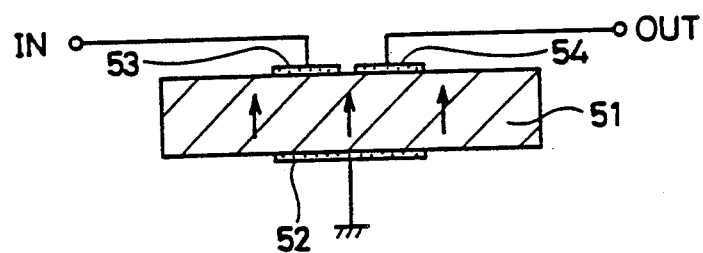
FIG. 7 is a schematic cross-sectional view showing a conventional piezoelectric filter.

Dispersion curves with respect to a second harmonic wave of the TE mode in the piezoelectric filter according to the embodiment shown in FIG. 4 is schematically shown in FIG. 6. FIG. 6 is a diagram which corresponds to FIG. 3 showing the previous embodiment. As obvious from FIG. 6, in the piezoelectric filter according to the present embodiment, the second harmonic wave is represented by the dispersion curve as shown in FIG. 6 in cases where the Poisson's ratio is both less than $\frac{1}{3}$ or $\frac{1}{3}$ or more. Therefore, trapping of vibratory energy is achieved irrespective of the value of the Poisson's ratio.

In the embodiment shown in FIG. 4, the input electrode 13 and the output electrode 14 are formed in positions, where they are not overlapped with each other in the direction of thickness, of the piezoelectric substrate 11. This is for reducing stray capacitance between the input electrode 13 and the output electrode 14, thereby to obtain reduced spurious filter characteristics.

Although the above described piezoelectric filters are discrete circuit elements, each of them may also be a chip-type part having protective substrates affixed to both its major surfaces and having outer electrodes formed on both its end surfaces, or they may be provided with lead terminals and sheathed with sheathing resin. In addition, although as illustrated in FIG. 1, the input and output electrodes and the earth electrode are connected to the exterior by lines, an electrode portion for soldering a lead-out electrode and a lead terminal so as to make connection with an outer electrode is generally formed integrally with the input and output electrodes or the like on the surface of the piezoelectric substrate.

Furthermore, although in the above described embodiments, the electrode patterns are formed by printing electrode pastes, they may be formed by other methods such as sputtering and vacuum evaporation.

Although embodiments of the present invention have been described and illustrated in detail, it is clearly understood that the same is by way of illustration and example only and is not to be taken by way of limitation, the spirit and scope of the present invention being limited only by the terms of the appended claims.

We claim:

1. A piezoelectric filter of an energy-trapped type utilizing the thickness-extensional vibration mode, comprising:
   a piezoelectric substrate;
   an earth electrode formed around the center of said piezoelectric substrate in the direction of thickness; and
   an input electrode and an output electrode formed on at least one of major surfaces of the piezoelectric substrate so as to be opposed to said earth electrode through a piezoelectric substrate portion;
   wherein said input electrode and said output electrode are respectively formed on one of the major surfaces and the other major surface of the piezoelectric substrate; and
   wherein said input electrode and said output electrode are formed so as to be overlapped with each other through the piezoelectric filter.

2. The piezoelectric filter according to claim 1, which utilizes a second harmonic wave of the thickness-extensional vibration mode.

3. The piezoelectric filter according to claim 1, wherein materials for making said piezoelectric substrate comprises materials having a Poisson's ratio of less than $\frac{1}{3}$.

4. The piezoelectric filter according to claim 1 further comprising respective conductive means for connecting said input and output electrodes to a signal source and to further circuitry, respectively, and for connecting said earth electrode to a ground potential, each of said conductive means being formed at a distinct position of the substrate so as not to overlap each other through the thickness of the piezoelectric substrate.

5. The piezoelectric filter according to claim 1 wherein the input and output electrodes have substantially the same surface are and are substantially symmetrically arranged with respect to said ground electrode.

6. The piezoelectric filter according to claim 5, wherein the piezoelectric filter is a double-mode filter wherein vibrations in a symmetrical mode and an asymmetrical mode are excited simultaneously.

7. A piezoelectric filter of an energy-trapped type utilizing the thickness-extensional vibration mode, comprising:
   a piezoelectric substrate;
   an earth electrode formed around the center of said piezoelectric substrate in the direction of thickness; and
   an input electrode and an output electrode formed on at least one of major surfaces of the piezoelectric substrate so as to be opposed to said earth electrode through a piezoelectric substrate portion;
   wherein said input and output electrodes are formed on one of the major surfaces of the piezoelectric substrate.

8. The piezoelectric filter according to claim 6, wherein at least a piezoelectric substrate portion between the major surface, provided with the input and output electrodes, of said piezoelectric substrate and the earth electrode is polarized in the direction of thickness.

9. The piezoelectric filter according to claim 7, wherein a piezoelectric substrate portion between said earth electrode and a major surface on the opposite side of the major surface provided with the input and output electrodes is polarized in the opposite direction to the piezoelectric substrate portion between the major surface, provided with the input and output electrodes, of said piezoelectric substrate and the earth electrode.

10. The piezoelectric filter according to claim 7, wherein a conductive film for frequency adjustment is formed on the major surface on the opposite side of the major surface, provided with the input and output electrodes, of said piezoelectric substrate.

11. The piezoelectric filter according to claim 7, wherein the whole of said piezoelectric substrate is uniformly polarized in the direction of thickness.

12. The piezoelectric filter according to claim 7, wherein the input and output electrodes have substantially the same surface area and are substantially symmetrically arranged with respect to said ground electrode.

13. The piezoelectric filter according to claim 12, wherein the piezoelectric filter is a double-mode filter wherein vibrations in a symmetrical mode and an asymmetrical mode are excited simultaneously.

14. The piezoelectric filter according to claim 7, which utilizes a second harmonic wave of the thickness-extensional vibration mode.

15. The piezoelectric filter according to claim 7, wherein said piezoelectric substrate comprises materials having a Poisson's ratio of less than $\frac{1}{3}$.

16. A three-terminal piezoelectric filter of an energy-trapped type utilizing the thickness-extensional vibration mode, said filter comprising:
   a piezoelectric substrate;
   a ground electrode connected to a ground potential and formed substantially halfway through said piezoelectric substrate in the direction of thickness; and
   an input electrode connected to a signal source and an output electrode connected to further circuitry, said input and output electrodes being formed on at least one of major surfaces of the piezoelectric substrate so as to be opposed to said grounded electrode through a piezoelectric substrate portion;
   wherein said input electrode and said output electrode are respectively formed on opposite major surfaces of the piezoelectric substrate; and
   wherein said input electrode and said output electrode are formed at distinct portions of the substrate so as not to be overlapped with each other through the thickness of the piezoelectric substrate.

17. The filter according to claim 15, which utilizes a second harmonic wave of the thickness-extensional vibration mode.

18. The filter according to claim 15, wherein said piezoelectric substrate comprises materials having a Poisson's ratio of less than $\frac{1}{3}$.

19. The filter according to claim 16, further comprising respective conductive means for connecting said input and output electrodes to said signal source and said further circuitry, respectively, and for connecting said ground electrode to said ground potential, each of said conductive means being formed at a distinct portion of the substrate so as not to overlap each other through the thickness of the piezoelectric substrate.

20. A three-terminal piezoelectric filter of an energy-trapped type utilizing the thickness-extensional vibration mode, said filter comprising:

a piezoelectric substrate;

a ground electrode connected to a group potential and formed substantially halfway through said piezoelectric substrate in the direction of thickness; and an input electrode connected to a signal source and an output electrode connected to further circuitry, said input and output electrodes being formed on at least one of major surfaces of the piezoelectric substrate so as to be opposed to said grounded electrode through a piezoelectric substrate portion; wherein said input and output electrodes are formed on one of the major surfaces of the piezoelectric substrate.

21. The filter according to claim 20, wherein a conductive film for frequency adjustment is formed on the major surface on the opposite side of the piezoelectric substrate from the major surface that is provided with the input and output electrodes.

22. The filter according to claim 20, wherein the input and output electrodes have substantially the same surface area and are substantially symmetrically arranged with respect to said ground electrode.

23. The filter according to claim 22, wherein the piezoelectric filter is a double-mode filter wherein vibrations in a symmetrical mode and an asymmetrical mode are excited simultaneously.

24. The filter according to claim 20, which utilizes a second harmonic wave of the thickness-extensional vibration mode.

25. The filter according to claim 20, wherein said piezoelectric substrate comprises materials having a Poisson's ratio of less than $\frac{1}{3}$.

* * * * *